Figure 1:
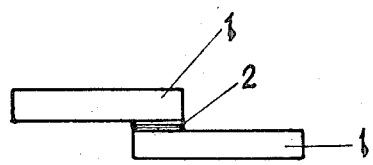

United States Patent [19]
Christie et al.

[11] 4,381,214
[45] Apr. 26, 1983

[54] PROCESS FOR GROWING CRYSTALS

[75] Inventors: Ian R. A. Christie, Middlesex; Derek F. Croxall, London; Brian J. Isherwood, Middlesex, all of United Kingdom

[73] Assignee: The General Electric Company Limited, London, England

[21] Appl. No.: 273,263

[22] Filed: Jun. 12, 1981

[30] Foreign Application Priority Data

Jun. 26, 1980 [GB] United Kingdom ................. 8021023

[51] Int. Cl.³ ............................................. C30B 7/10
[52] U.S. Cl. ......................... 456/623 Q; 156/DIG. 98
[58] Field of Search ............... 156/624, 623 R, 623 Q, 156/610, 612, DIG. 65; 427/86, 89; 148/179, 184

[56] References Cited

U.S. PATENT DOCUMENTS

| | | | |
|---|---|---|---|
| 2,701,326 | 2/1955 | Pfann et al. | 148/184 |
| 2,990,502 | 6/1961 | Willemse et al. | 148/184 |
| 2,996,456 | 8/1961 | Hergenrother | 156/624 |
| 3,615,933 | 10/1971 | Dahlberg | 148/184 |
| 4,121,965 | 10/1978 | Leipold | 156/DIG. 65 |

FOREIGN PATENT DOCUMENTS

| | | |
|---|---|---|
| 894241 | 6/1960 | United Kingdom ....... 156/DIG. 65 |
| 1031314 | 6/1966 | United Kingdom . |
| 1431021 | 4/1976 | United Kingdom . |

OTHER PUBLICATIONS

Holloway, "Gold/Chromium Metalizations", published in Gold Bull., Jul. 1974, vol. 12 (3), pp. 99–106.

Primary Examiner—Hiram H. Bernstein
Attorney, Agent, or Firm—Kirschstein, Kirschstein, Ottinger & Cobrin

[57] ABSTRACT

According to this invention a process for forming a crystal of a substance comprises securing surfaces of two crystals (1) together with the axes of the crystals aligned and depositing said substance onto the joined crystals thereby causing them to grow into a single crystal substantially or entirely surrounding the registering regions (2) of said surfaces.

A resultant crystal may be sectioned to provide large, single crystals (3) not containing a bonded region.

10 Claims, 2 Drawing Figures

PROCESS FOR GROWING CRYSTALS

This invention relates to processes for growing large, single crystals of substances of which suitably sized seed crystals are difficult to obtain. The invention relates especially but not exclusively to the production of quartz crystals.

A demand exists, for certain filter applications, for a supply of long lengths (e.g. 30 cm.) of single crystal quartz. Natural crystals of good quality and of the required length suitable for use as seeds for synthetic crystals are scarce and expensive. Moreover since quartz has the property that overgrowth on a seed crystal is always of a shorter dimension than the seed, the lengths of quartz crystals produced synthetically by existing techniques have been limited.

According to this invention a process for forming a crystal of a substance comprises the steps of securing a crystal face of a first seed crystal to the crystal face of a second seed crystal with the axes of the two crystals aligned and depositing the said substance onto the joined crystals thereby causing them to grow into a single crystal substantially or entirely enclosing the registering regions of said crystal faces.

Large single crystals of substances may be grown by this process. A resultant crystal may be sectioned to provide large, single crystals not containing a bonded region.

The process may be modified so that a multiplicity of suitably aligned seed crystals may be bonded together and grown into a single crystal.

The bonding material preferably comprises a metal having the property that two layers of the metal each deposited onto a surface of a respective crystal may be fused together by heating the layers while pressed together.

The metal used for bonding seed crystals is preferably gold.

Figure 2:
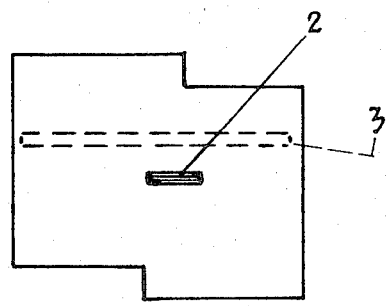

The invention may be better understood from the following example of an embodiment in accordance with the invention with reference to FIGS. 1 and 2 of the accompanying drawings.

FIG. 1 shows two quartz seed crystals bonded together for use in growing a crystal according to the invention, and FIG. 2 shows the crystals illustrated in FIG. 1 after they have been grown into a single crystal.

With reference to FIG. 1, two quartz seed crystals 1 are bonded together as follows. The portion of each crystal which is to be bonded to the other is coated to a thickness of 200 Angstroms with a nickel-chromium alloy by vapour deposition of the latter onto the said portion. The coating of nickel-chromium alloy provides a firm foundation for a layer of gold 2 which is evaporated onto the nickel-chromium layer to a depth of 2000 Angstroms and then electroplated to a thickness of 10 to 15 microns. The two crystals 1 are clamped together with the gold plated regions pressed together under a pressure of 100 pounds per square inch with the axes of the crystals aligned. The assembly is placed in a furnace and heated to 300° C. for 2 hours. The gold layers fuse together at this temperature thereby bonding the crystals. Subsequent overgrowth of the joined crystals in an autoclave in a 3 molar solution of sodium hydroxide saturated with respect to $SiO_2$ as used in growing quartz crystals by existing techniques, at a temperature of 300°–400° C. (preferably 350° C., with a temperature gradient of 50° C.) and a pressure of between 1000 and 2000 atmospheres (preferably approximately 1000 atmospheres) for six weeks produces a single large quartz crystal as shown in FIG. 2. Such a crystal has a greater overall length than a crystal grown from a single seed. Quartz wafers with a correspondingly greater length may be cut from such a crystal e.g. as shown at 3. Alternatively a crystal produced by a method according to the invention may be cut so that the metal bonding layer 2 is retained in the crystal. Quartz crystals containing an almost completely embedded metal strip to which electrical contact can be made have applications as resonators.

This invention includes crystals grown by a method according to the invention.

We claim:

1. A process for forming a crystal of a substance from a solution capable of depositing said substance, utilizing at least two seed crystals of said substance, the seed crystals defining crystallographic axes and being provided with respective flat surfaces, the orientations of the said surfaces with respect to the associated said axes being such that at least one pair of seed crystals may be interfaced at their said surfaces with a zero mutual crystallographic orientation; said process comprising the steps of mutually aligning said pair of seed crystals into said orientation, directly bonding their said flat surfaces together with an inert bonding material to form a seed crystal composite of locally uniform crystallographic orientation having at least one registering surface region, and depositing said substance from said solution on to said composite so as to substantially enclose said registering surface region.

2. A process according to claim 1 in which at least two of said flat surfaces are bonded together in an overlapping relationship.

3. A process according to claim 1 in which a multiplicity of seed crystals are bonded to one another at respective flat surfaces.

4. A process according to claim 1 in which the bonding material comprises a metal or an alloy.

5. A process according to claim 4 in which the said seed crystals are bonded together by depositing a layer of the said metal or alloy on to a region of a said flat surface of each seed crystal, pressing the two deposited layers of metal or alloy together and heating to fuse the two layers and form a bond between them.

6. A process according to claim 4 or claim 5 in which the metal or alloy is deposited onto each said region by a vapour deposition technique.

7. A process according to claim 5 in which a layer of gold is deposited onto a layer of nickel chromium alloy initially deposited onto each said region.

8. A process according to claim 1 for growing a quartz crystal wherein the solution is a hydrothermal solution capable of depositing quartz and the seed crystals are of quartz.

9. A process according to claim 8 carried out a temperature of 300° to 400° C. and a pressure of 1000 to 2000 atmospheres.

10. A quartz crystal grown by a process as claimed in claim 8 or claim 9.

* * * * *